(12) United States Patent
Morioka et al.

(10) Patent No.: US 8,269,237 B2
(45) Date of Patent: Sep. 18, 2012

(54) LIGHT-EMITTING DEVICE, AND ILLUMINATION APPARATUS AND DISPLAY APPARATUS USING THE LIGHT-EMITTING DEVICE

(75) Inventors: Tatsuya Morioka, Ikoma (JP); Osamu Kawasaki, Tenri (JP)

(73) Assignee: Sharp Kabushiki Kaisha, Osaka (JP)

(*) Notice: Subject to any disclaimer, the term of this patent is extended or adjusted under 35 U.S.C. 154(b) by 192 days.

(21) Appl. No.: 11/316,978

(22) Filed: Dec. 27, 2005

(65) Prior Publication Data

US 2006/0139926 A1    Jun. 29, 2006

(30) Foreign Application Priority Data

Dec. 28, 2004  (JP) ................................. 2004-379247
Dec. 1, 2005   (JP) ................................. 2005-348177

(51) Int. Cl.
*H01L 33/00* (2010.01)
(52) U.S. Cl. ............... 257/98; 257/99; 257/E33.071
(58) Field of Classification Search .............. 362/260; 257/79, 80, 98, 99, 100
See application file for complete search history.

(56) References Cited

U.S. PATENT DOCUMENTS

| | | | | |
|---|---|---|---|---|
| 6,067,157 | A * | 5/2000 | Altendorf | 356/337 |
| 6,333,724 | B1 * | 12/2001 | Taira et al. | 345/5 |
| 6,472,765 | B1 * | 10/2002 | Sano et al. | 257/787 |
| 7,078,732 | B1 | 7/2006 | Reeh et al. | |
| 7,382,091 | B2 * | 6/2008 | Chen et al. | 313/512 |
| 2001/0000622 | A1 | 5/2001 | Reeh et al. | |
| 2001/0002049 | A1 | 5/2001 | Reeh et al. | |
| 2001/0030326 | A1 | 10/2001 | Reeh et al. | |
| 2004/0066815 | A1 | 4/2004 | Okazaki | |
| 2004/0070333 | A1 * | 4/2004 | Lin et al. | 313/500 |
| 2004/0145895 | A1 * | 7/2004 | Ouderkirk et al. | 362/260 |
| 2004/0233664 | A1 * | 11/2004 | Beeson et al. | 362/231 |
| 2005/0161694 | A1 | 7/2005 | Reeh et al. | |

FOREIGN PATENT DOCUMENTS

| | | |
|---|---|---|
| EP | 1 168 535 A1 | 1/2002 |
| JP | 2000-512806 T | 9/2000 |
| JP | 2000-286455 A | 10/2000 |
| JP | 2004-128273 A | 4/2004 |
| WO | WO-00/60711 A1 | 10/2000 |
| WO | WO 2004030109 A1 * | 4/2004 |

* cited by examiner

*Primary Examiner* — Wael Fahmy
*Assistant Examiner* — Sarah Salerno
(74) *Attorney, Agent, or Firm* — Birch, Stewart, Kolasch & Birch, LLP

(57) ABSTRACT

A light-emitting device including a light-emitting element emitting excitation light for exciting a fluorescent body, a dispersion body having the fluorescent body dispersed therein, which fluorescent body emits fluorescent light having a wavelength different from that of the excitation light, and a lead frame holding the light-emitting element and the dispersion body, wherein at least a portion of the fluorescent light emitted from the fluorescent body in the dispersion body is output to the outside from a side of the dispersion body receiving the excitation light. With this, a light-emitting device having high light output efficiency and an illumination apparatus and a display apparatus using the light-emitting device are provided.

15 Claims, 9 Drawing Sheets

LIGHT-EMITTING DEVICE, AND ILLUMINATION APPARATUS AND DISPLAY APPARATUS USING THE LIGHT-EMITTING DEVICE

This nonprovisional application is based on Japanese Patent Applications Nos. 2004-379247 and 2005-348177 filed with the Japan Patent Office on Dec. 28, 2004 and Dec. 1, 2005, respectively, the entire contents of which are hereby incorporated by reference.

BACKGROUND OF THE INVENTION

1. Field of the Invention

The present invention relates to a light-emitting device including a fluorescent body which absorbs excitation light from a light-emitting element and emits light having a wavelength different from that of the excitation light, and to an illumination apparatus and a display apparatus using the light-emitting device.

2. Description of the Background Art

Recently, a solid-state illumination technique (a semiconductor illumination technique) has been rapidly developed, which implements emission of light of white or other colors using a fluorescent body and a solid-state light-emitting element as an excitation light source for exciting the fluorescent body. Examples of such technique include a light-emitting device for obtaining pseudo-white light with a combination of a blue light-emitting element and a fluorescent body which absorbs blue light emitted from the blue light-emitting element and emits yellow light, and a light-emitting device for obtaining white light with a combination of an ultraviolet light-emitting element and red, green and blue fluorescent bodies which absorb ultraviolet light emitted from the ultraviolet light-emitting element and emit red, green and blue light, respectively.

The former light-emitting device has an inferior color rendering property because it includes less red component, but high light emission efficiency is expected since it has only a small loss regarding color conversion (a Stokes loss). The latter light-emitting device, on the other hand, has a good color rendering property.

Currently, the light-emitting device as such is generally formed as a shell-shaped type or a surface-mounted type. Referring to FIG. 17, a shell-shaped light-emitting device, for example, includes a lead frame 1706 on which a light-emitting element 1701 emitting excitation light for exciting a fluorescent body is mounted. One electrode of light-emitting element 1701 is electrically connected via a wire 1703a to lead frame 1706 which is electrically connected to one electrode terminal 1707a, and the other electrode of light-emitting element 1701 is electrically connected to the other electrode terminal 1707b via a wire 1703b. Light-emitting element 1701 is covered with a dispersion body 1705 in which a fluorescent body 1704 is dispersed. Blue excitation light emitted from a blue light-emitting element, for example, is partially absorbed by, for example, a YAG:Ce (yttrium-aluminium-garnet activated with cerium) fluorescent body covering the light-emitting element. Fluorescent light emitted from the fluorescent body excited with excitation light is propagated through dispersion body 1705 in which the fluorescent body is dispersed. Fluorescent light is transmitted through dispersion body 1705, and efficiently output to the outside with an exterior body 1709 having a convex surface to function as a lens (for example, see Japanese Patent Laying-Open No. 2000-286455). The light-emitting device having such structure, however, still has insufficient light output efficiency, and therefore development of a light-emitting device having higher light output efficiency has been desired.

SUMMARY OF THE INVENTION

An object of the present invention is to provide a light-emitting device having high light output efficiency and an illumination apparatus and a display apparatus using the light-emitting device.

The present invention is a light-emitting device including a light-emitting element emitting excitation light for exciting a fluorescent body, a dispersion body having the fluorescent body dispersed therein, which fluorescent body emits fluorescent light having a wavelength different from that of the excitation light, and a lead frame holding the light-emitting element and the dispersion body, wherein at least a portion of the fluorescent light emitted from the fluorescent body in the dispersion body is output to the outside from a side of the dispersion body receiving the excitation light.

In the light-emitting device according to the present invention, a content of the fluorescent body in the dispersion body can be set such that, in fluorescent light emitted from the fluorescent body in the dispersion body, intensity of reflected fluorescent light emitted to the side receiving the excitation light becomes larger than intensity of transmitted fluorescent light emitted to a side transmitting the excitation light. In addition, a content of the fluorescent body in the dispersion body can be set such that, in fluorescent light emitted from the fluorescent body in the dispersion body, a total value of intensity of reflected fluorescent light emitted to the side receiving the excitation light and intensity of transmitted fluorescent light emitted to the side transmitting the excitation light becomes at least 90% of a maximum value thereof.

In the light-emitting device according to the present invention, the light-emitting element can be formed with at least one nitride-based semiconductor laser, and the nitride-based semiconductor laser and the dispersion body can be arranged such that light emitted from the nitride-based semiconductor laser enters the dispersion body with P polarization.

In the light-emitting device according to the present invention, a light emission peak wavelength of the light-emitting element can be from 400 nm to 420 nm. At least one fluorescent body selected from the group consisting of a red fluorescent body, a green fluorescent body, a blue fluorescent body, and an yellow fluorescent body can be dispersed in the dispersion body, and an optical film reflecting at least one of the excitation light and the fluorescent light can be provided on a side of the dispersion body transmitting the excitation light. The optical film can be formed with at least one of a metal film and a film having a light scattering material dispersed therein. A light dispersion material can be further dispersed in the dispersion body. The side of the dispersion body receiving the excitation light can have a convex surface.

In addition, in the light-emitting device according to the present invention, the lead frame holding the light-emitting element and the dispersion body can have a concave portion for collecting the fluorescent light emitted from the fluorescent body in the dispersion body substantially in one direction, and at least one of a metal film and a film having a light scattering material dispersed therein can be formed on a surface of the lead frame holding the light-emitting element and the dispersion body. In addition, an optical film including a light diffusion material for diffusing at least one of the excitation light and the fluorescent light can be provided on at least one region of a window portion for outputting the fluorescent light emitted from the fluorescent body in the dispersion body to the outside. In addition, an exterior body can be formed to cover the light-emitting element and the dispersion body, and a window portion surface of the exterior body for outputting the fluorescent light can be formed in a convex shape.

In addition, the present invention is an illumination apparatus including at least one light-emitting device described above. In addition, the present invention is a display apparatus including at least one light-emitting device described above, wherein a modulator for modulating intensity of light emitted from the light-emitting device and color filters arranged in a matrix to receive light modulated with the modulator are provided.

According to the present invention, a light-emitting device having high light output efficiency and an illumination apparatus and a display apparatus using the light-emitting device can be provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8A shows a situation of excitation light entering the dispersion body with P polarization and FIG. 8B shows a situation of excitation light entering the dispersion body with S polarization.

DESCRIPTION OF THE PREFERRED EMBODIMENTS

First Embodiment

Figure 1:
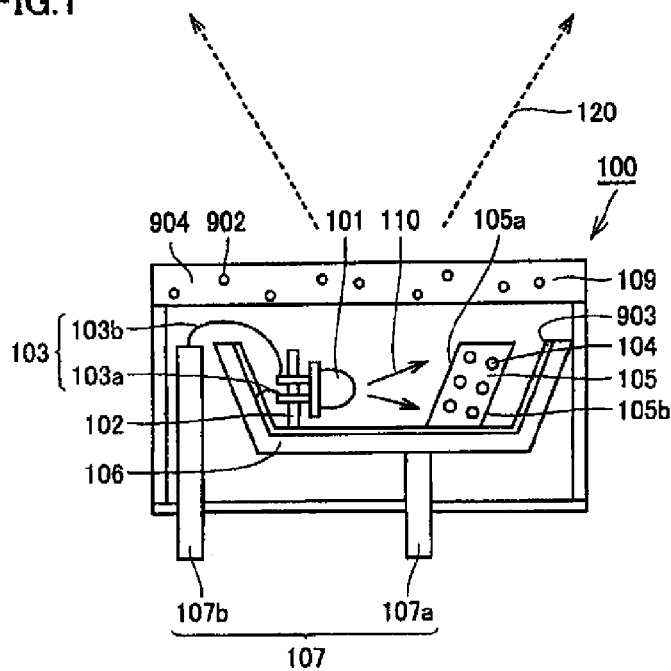
FIG. 1 is a schematic diagram of an embodiment of a light-emitting device according to the present invention.

Referring to FIG. 1, an embodiment of a light-emitting device 100 according to the present invention includes a light-emitting element 101 emitting excitation light 110 for exciting a fluorescent body 104, a dispersion body 105 having fluorescent body 104 dispersed therein, which fluorescent body 104 emits fluorescent light 120 having a wavelength different from that of excitation light 110, and a lead frame 106 holding light-emitting element 101 and dispersion body 105, wherein at least a portion of the fluorescent light emitted from fluorescent body 104 in dispersion body 105 is output to the outside from a side 105a of dispersion body 105 receiving the excitation light.

More specifically, in light-emitting device 100 of this embodiment, a shell-shaped nitride-based semiconductor light-emitting diode having a light emission peak wavelength of 405 nm as light-emitting element 101 is fixed to lead frame 106 with a support body 102. The nitride-based semiconductor light-emitting diode (light-emitting element 101) has two electrode pins, and one of the electrode pins is electrically connected via a wire 103a to lead frame 106 which is electrically connected to one electrode terminal 107a, while the other of the electrode pins is electrically connected to the other electrode terminal 107b via a wire 103b. Dispersion body 105 is arranged on lead frame 106 in such a manner that, at least a portion of fluorescent light emitted from fluorescent body 104 excited with excitation light 110 emitted from light-emitting element 101 is output from side 105a of dispersion body 105 receiving excitation light 110. Lead frame 106 holding light-emitting element 101 and dispersion body 105 has a concave portion which can collect fluorescent light from fluorescent body 104 substantially in one direction. In addition, an Au film 903 is formed on a surface of lead frame 106 to increase output efficiency of fluorescent light.

Embodiment 1A

A more specific embodiment of the first embodiment is shown in this embodiment. Referring to FIG. 1, dispersion body 105 used in light-emitting device 100 of this embodiment is formed by dispersing red, green and blue fluorescent bodies, which are excited with excitation light having a light emission peak wavelength of 405 nm emitted from the nitride-based semiconductor light-emitting diode (light-emitting element 101), in an epoxy resin plate having a thickness of 5 mm in such a ratio that, a white color indicated with chromaticity coordinates of x=0.32 and y=0.32 is formed with red, green and blue fluorescent light respectively emitted from the fluorescent bodies. Herein, $Y_2O_2S:Eu^{3+}$ having a fluorescent light peak wavelength of 635 nm is used as the red fluorescent body, ZnS:Cu, Al having a fluorescent light peak wavelength of 520 nm is used as the green fluorescent body, and $(Sr, Ca, Ba, Mg)_{10}(PO_4)_6:Eu^{2+}$ having a fluorescent light peak wavelength of 480 nm is used as the blue fluorescent body.

Figure 2:
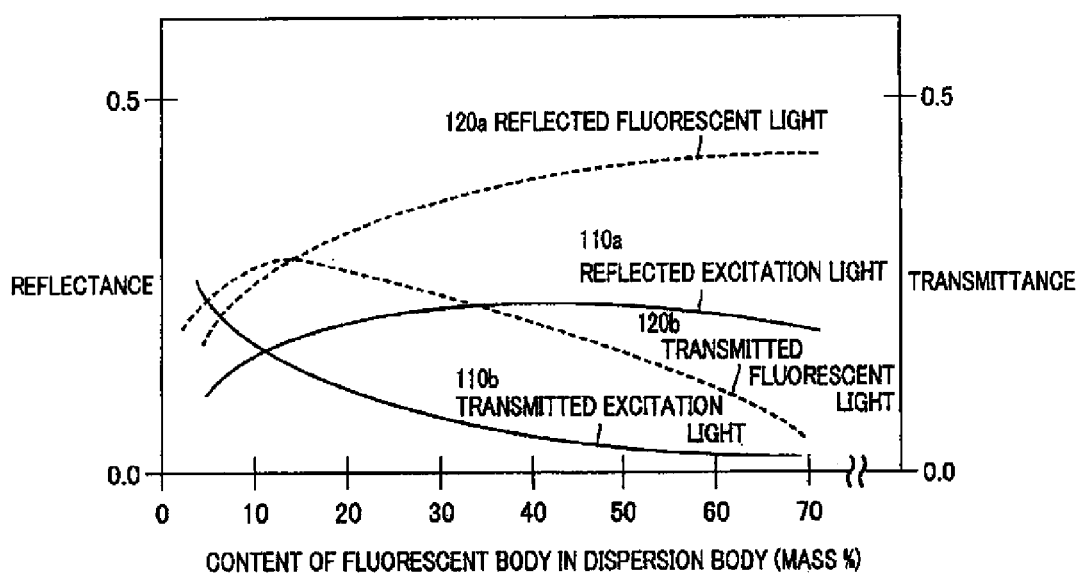
FIG. 2 is a diagram indicating relations of a content of a fluorescent body in a dispersion body to reflectances and transmittances of excitation light and fluorescent light emitted from the dispersion body.
Figure 3:
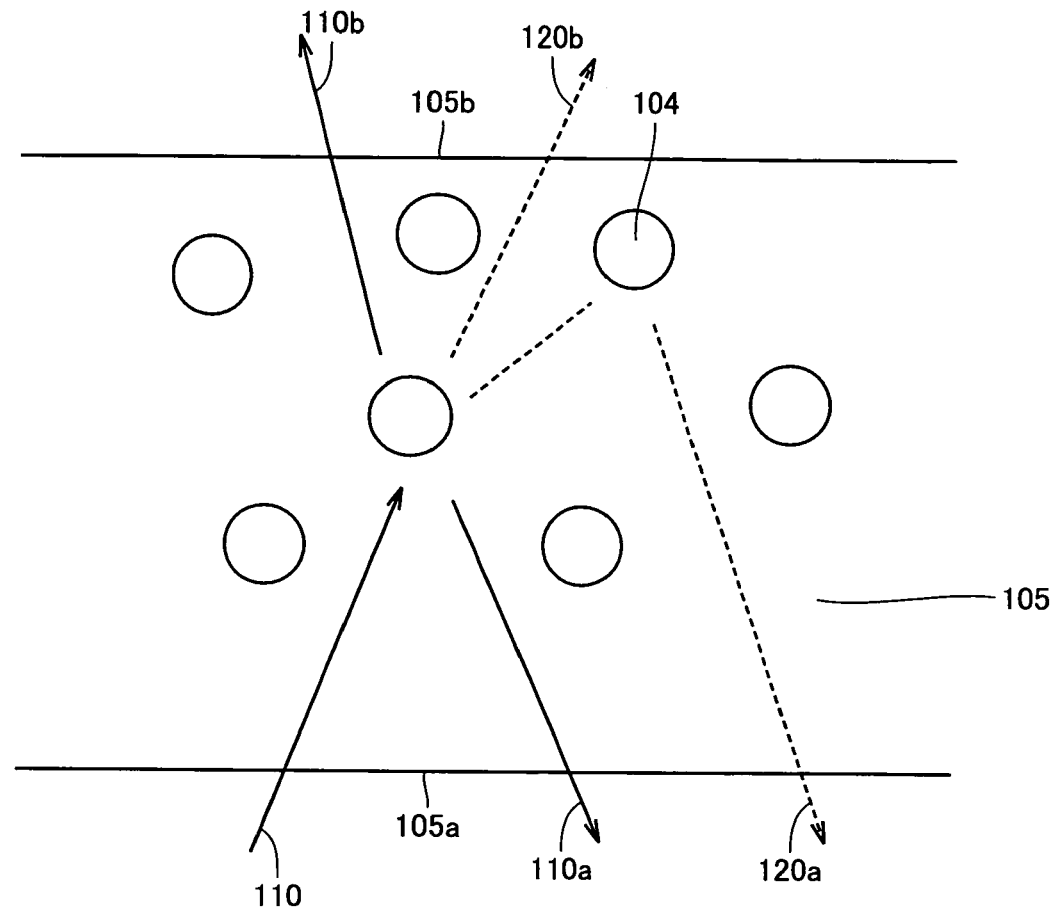
FIG. 3 is a schematic diagram indicating relations among incident excitation light, reflected excitation light, transmitted excitation light, reflected fluorescent light, and transmitted fluorescent light.

FIG. 2 indicates relations of a content (mass %) of fluorescent body 104 in dispersion body 105 to reflectances and transmittances of excitation light and fluorescent light emitted from the dispersion body in this embodiment. As shown in FIG. 3, excitation light entering dispersion body 105 (incident excitation light 110) causes light scattering and light transmission in fluorescent body 104 dispersed in dispersion body 105 to generate reflected excitation light 110a, which is excitation light emitted to side 105a receiving the excitation light, and transmitted excitation light 110b, which is excitation light emitted to a side 105b transmitting the excitation light (a side opposite to receiving side 105a). In addition, fluorescent light emitted from fluorescent body 104 causes light scattering and light transmission in another fluorescent body 104 to generate reflected fluorescent light 120a, which is fluorescent light emitted to side 105a receiving the excitation light, and transmitted fluorescent light 120b, which is fluorescent light emitted to the side transmitting the excitation light. The relations of a content of the fluorescent body in the dispersion body to the reflected excitation light, transmitted excitation light, reflected fluorescent light, and transmitted fluorescent light indicated in FIG. 2 are calculated using a method of ray tracing.

As is obvious from FIG. 2, when the content of fluorescent body 104 in dispersion body 105 is low, the excitation light is transmitted before sufficiently absorbed by fluorescent body 104. Thus, transmittance of the excitation light (transmitted excitation light 110b) is monotonously decreased as the content of the fluorescent body is increased because absorption and scattering of the excitation light by the fluorescent body increase. On the other hand, the reflectance of the excitation light (reflected excitation light 110a) is first increased as the content of the fluorescent body is increased, and is then saturated. This is because, though scattering of the excitation light is small when the content of the fluorescent body is low, a component scattered by the fluorescent body and a component absorbed by the fluorescent body increase as the content of the fluorescent body is increased.

In addition, the reflectance of the fluorescent light (reflected fluorescent light 120a) is increased as the content of the fluorescent body is increased, and is then saturated. This is because the fluorescent light emitted from fluorescent body 104 in dispersion body 105 is more scattered by the fluorescent body as the content of the fluorescent body is increased. On the other hand, the transmittance of the fluorescent light (transmitted fluorescent light 120b) is first gradually increased to reach a maximum value at about 12 mass % in this embodiment, and is then decreased. This is because, as the content of the fluorescent body is increased, the fluorescent light emitted from fluorescent body 104 in dispersion body 105 is more scattered by the fluorescent body and is less transmitted. When the content is about 12 mass % or higher, the reflectance of the fluorescent light (reflected fluorescent light 120a) is higher than the transmittance of the fluorescent light (transmitted fluorescent light 120b).

That is, referring to FIGS. 1-3, it is preferable to set a content of fluorescent body 104 in dispersion body 105 such that, in fluorescent light emitted from fluorescent body 104 in dispersion body 105, intensity of reflected fluorescent light 120a emitted to side 105a receiving excitation light 110 becomes larger than intensity of transmitted fluorescent light 120b emitted to side 105b transmitting excitation light 110. With the dispersion body having a fluorescent body content as such, light-emitting device 100 of this embodiment characterized by at least a portion of fluorescent light output to the outside from side 105a of dispersion body 105 receiving excitation light 110 can have increased light output efficiency.

Though an optimum value of the content of the fluorescent body varies to some degree depending on physical values of fluorescent body 104, such as a particle diameter and a refractive index, or a kind (a refractive index) of the dispersion body, a tendency of the relations as indicated in FIG. 2 is similar in any situation. That is, as is obvious from a result of calculation indicated, the content of the fluorescent body (that is, an amount of dispersion of the fluorescent body) in the dispersion body must be increased to allow the fluorescent body to sufficiently absorb the excitation light.

Therefore, in a conventional light-emitting device having a construction in which a light-emitting element is covered with a binder including a fluorescent body, fluorescent light emitted from the fluorescent body is reflected and scattered among portions such as the fluorescent body in the binder and a metal portion on which the light-emitting element is mounted, which results in generation of a loss component which has been absorbed by the metal portion or the like.

In contrast, the light-emitting device according to the present invention can decrease light absorption in the metal portion on which the light-emitting element is mounted by multiple reflection and/or scattering between the fluorescent body and the metal portion, and can efficiently output the fluorescent light emitted from the fluorescent body to the outside. Referring to FIG. 1, in this embodiment, fluorescent light 120 emitted from fluorescent body 104 in dispersion body 105 is output to the outside from a window portion 109 for outputting the fluorescent light.

Figure 4:
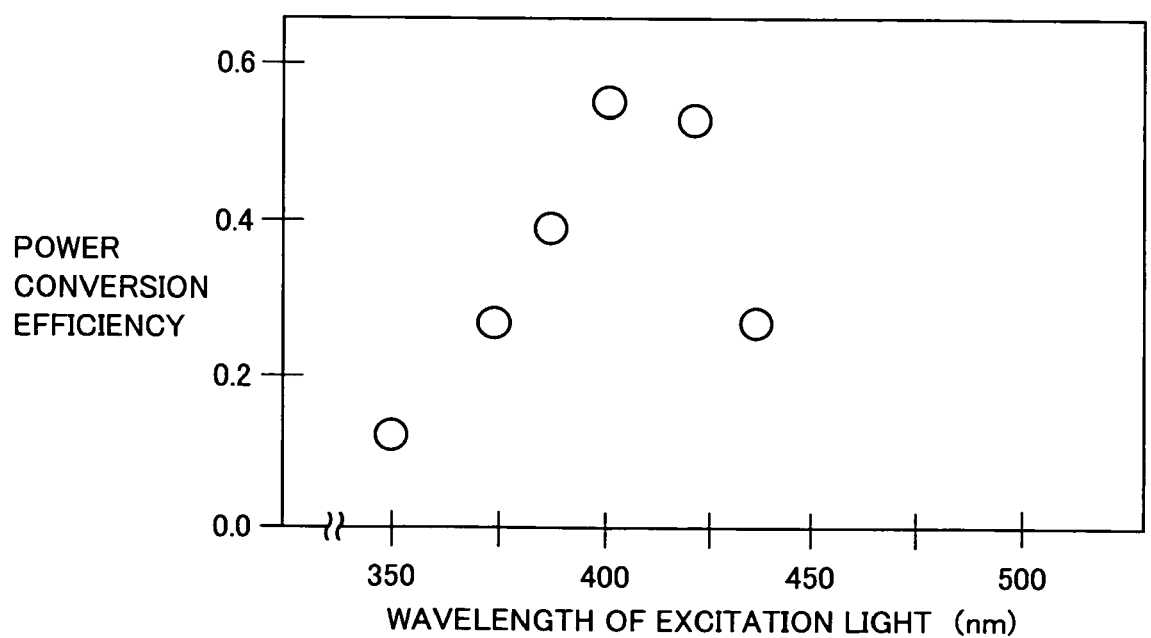
FIG. 4 is a diagram indicating a relation between a wavelength of excitation light of a light-emitting element and power conversion efficiency.

FIG. 4 indicates a relation between a ratio of a power converted to the excitation light to a power applied to the light-emitting diode as the light-emitting element (power conversion efficiency) and a wavelength of the excitation light of the light-emitting element in this embodiment. With use of the light-emitting element having a light emission peak wavelength of the excitation light of 400-420 nm, the power conversion efficiency of the light-emitting element can be increased and, together with increased light output efficiency described above, a desirable light-emitting device having a low power consumption property can be implemented. In addition, deterioration of the epoxy resin by an ultraviolet light component of at most 400 nm can also be avoided by using the excitation light having the light emission peak wavelength of 400-420 nm. Furthermore, for eyes of humans, since light having a wavelength of 400-420 nm has a value of a luminosity curve of approximately 0, the excitation light which is emitted without absorbed by the fluorescent body does not affect chromaticity of a color (for example, white) obtained by mixing of fluorescent light emitted from the fluorescent body. It is to be noted that, a material of the binder for forming the dispersion body having the fluorescent body dispersed therein is not specifically limited as long as the material transmits the excitation light and the fluorescent light and, besides the epoxy resin described above, an organic material such as a polycarbonate resin or an acrylic resin, an inorganic material such as glass, or the like can also be used.

As an alternative light-emitting device using other light-emitting element and dispersion body, a light-emitting device emitting white light can also be formed using an InGaN-based light-emitting diode having a light emission peak wavelength of 480 nm and a dispersion body having an yellow YAG:Ce fluorescent body having a fluorescent light peak wavelength of about 580 nm dispersed therein.

In addition, in this embodiment, evenness of intensity of emitted fluorescent light is increased by using an optical film 904 having a light diffusion material 902 for diffusing fluorescent light (for example, $TiO_2$ particles, which are not shown) dispersed therein as at least one region of window portion (window portion for outputting light) 109 from which the fluorescent light is output.

Embodiment 1B

Figure 5:
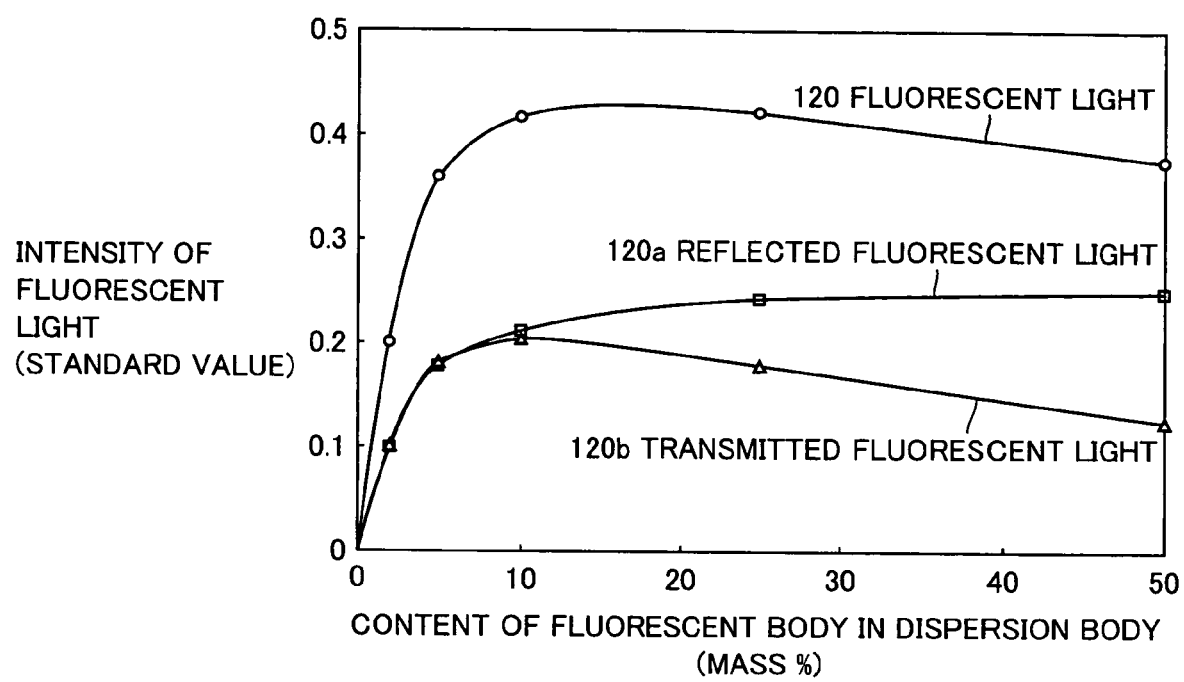
FIG. 5 is a diagram indicating a relation between a content of a fluorescent body in a dispersion body and intensity of fluorescent light.

Another specific embodiment of the first embodiment is shown in this embodiment. Referring to FIG. 1, light-emitting device 100 of this embodiment is similar to the light-emitting device of the embodiment 1A except that $SrAl_2O_4:Eu^{2+}$, a green fluorescent body having a fluorescent light peak wavelength of 520 nm, is used as fluorescent body 104 in dispersion body 105. FIG. 5 shows a relation between a content of fluorescent body 104 in dispersion body 105 in the light-emitting device of this embodiment and intensity of each of reflected fluorescent light 120a and transmitted fluorescent light 120b from fluorescent body 104 as well as whole fluorescent light 120 which is a sum of the reflected fluorescent light and the transmitted fluorescent light. In FIG. 5, intensity of fluorescent light is indicated as a standard value which is relative intensity when intensity of excitation light 110 used to irradiate the fluorescent body is set to 1.

Referring to FIG. 5, in terms of increasing light output efficiency of the light-emitting device of this embodiment, the content of the fluorescent body in the dispersion body in this embodiment is preferably set so as to increase, in fluorescent light emitted from the fluorescent body in the dispersion body, a total value of intensity of reflected fluorescent light emitted to the side receiving the excitation light and intensity of transmitted fluorescent light emitted to the side transmitting the excitation light. More specifically, the content of the fluorescent body is preferably set such that, in fluorescent light emitted from the fluorescent body, a total value of intensity of reflected fluorescent light and intensity of transmitted fluorescent light becomes at least 90% of a maximum value thereof and, more preferably, at least 95% of the maximum value thereof. When the total value of intensity of reflected fluorescent light and intensity of transmitted fluorescent light is lower than 90% of the maximum value thereof, intensity of fluorescent light significantly decreases.

In addition, in terms of further increasing light output efficiency of the light-emitting device of this embodiment, the content of the fluorescent body in the dispersion body in this embodiment is further preferably set such that, in fluorescent light emitted from the fluorescent body in the dispersion body, intensity of reflected fluorescent light becomes larger than intensity of transmitted fluorescent light, and the total value of intensity of reflected fluorescent light and intensity of transmitted fluorescent light becomes at least 90% of the maximum value thereof. More specifically, in the light-emitting device of this embodiment, the content of the fluorescent body in the dispersion body is preferably 10-25 mass %.

Though the relation between the content of the fluorescent body in the dispersion body and intensity of fluorescent light in a situation of using the green fluorescent body as the fluorescent body is indicated in this embodiment, it became apparent that when appropriate amounts of $0.5MgF_2 \cdot 3.5MgO \cdot GeO_2:Mn^{4+}$, a red fluorescent body having a fluorescent light peak wavelength of 660 nm, and $BaMgAl_{10}O_{17}:Eu^{2+}$, a blue fluorescent body having a fluorescent light peak wavelength of 460 nm, are dispersed besides the green fluorescent body $SrAl_2O_4:Eu^{2+}$ used in this embodiment as fluorescent bodies to obtain light of a white color indicated with chromaticity coordinates of x=0.32 and y=0.32, a total content of these fluorescent bodies is also preferably set so as to increase a total value of intensity of reflected fluorescent light and intensity of transmitted fluorescent light.

Second Embodiment

Figure 6:
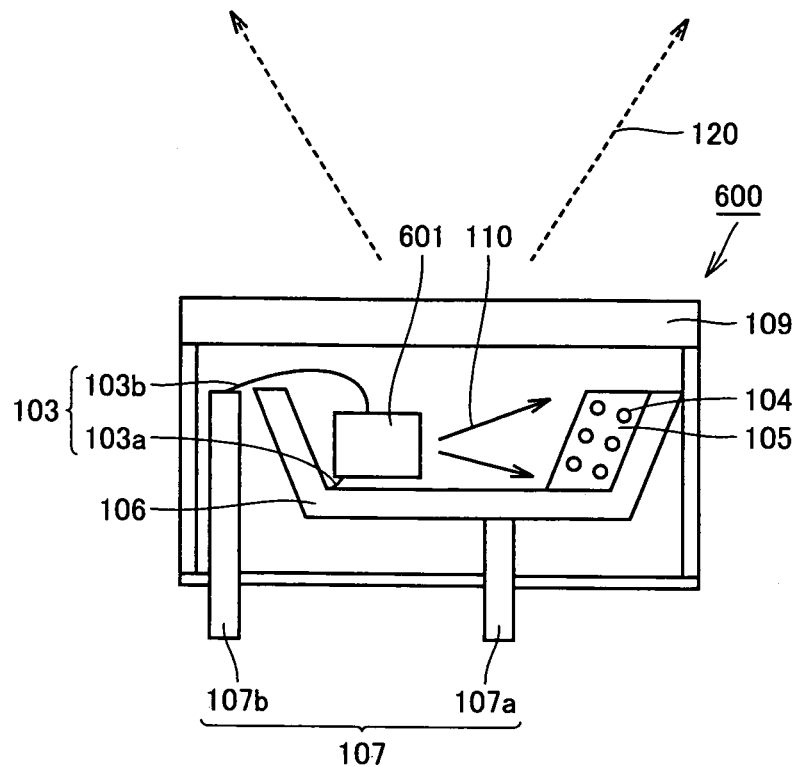
FIG. 6 is a schematic diagram of another embodiment of the light-emitting device according to the present invention.

Referring to FIG. 6, another embodiment of light-emitting device 600 according to the present invention includes a light-emitting element 601 emitting excitation light for exciting fluorescent body 104, dispersion body 105 having fluorescent body 104 dispersed therein, which fluorescent body 104 emits fluorescent light having a wavelength different from that of the excitation light, and lead frame 106 holding light-emitting element 601 and dispersion body 105, wherein at least a portion of the fluorescent light emitted from fluorescent body 104 in dispersion body 105 is output to the outside from side 105a of the dispersion body receiving the excitation light.

This embodiment has a structure similar to that of the first embodiment except that, in contrast to the first embodiment using the nitride-based semiconductor light-emitting diode as the light-emitting element, a nitride-based semiconductor laser is used as light-emitting element 601.

Figure 7:
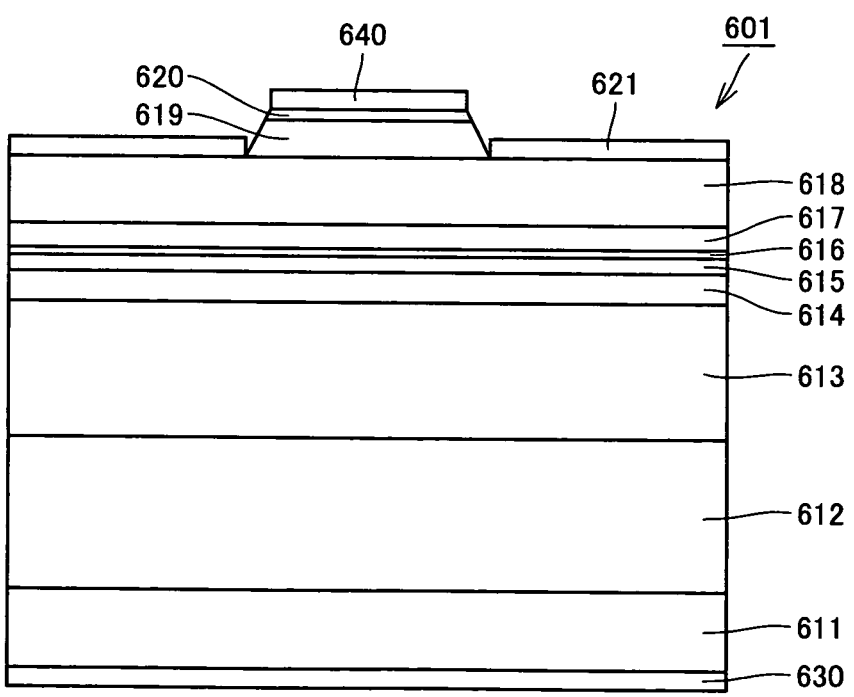
FIG. 7 is a schematic diagram of a light-emitting element in another embodiment of the light-emitting device according to the present invention.

Though the nitride-based semiconductor laser used in this embodiment is not specifically limited, it may have, for example, a structure as shown in FIG. 7. Referring to FIG. 7, the nitride-based semiconductor laser (light-emitting element 601) includes an n-type GaN substrate 611 on which an n-type GaN layer 612 having a thickness of 1 μm, an n-type AlGaN clad layer 613 having a thickness of 2 μm, an n-type GaN light guide layer 614 having a thickness of 0.1 μm, a multiple quantum well active layer 615 having a thickness of 18 nm formed with three pairs of InGaN layer/GaN layer, a p-type AlGaN carrier block layer 616 having a thickness of 20 nm, a p-type GaN light guide layer 617 having a thickness of 0.1 μm, a p-type second AlGaN clad layer 618 having a thickness of 0.3 μm, a p-type first AlGaN clad layer 619 having a thickness of 0.5 μm, and a p-type GaN contact layer 620 having a thickness of 1 μm are successively formed. In addition, an n-side electrode 630 is formed on a surface of n-type GaN substrate 611 on which a semiconductor layer is not formed, and a p-side electrode 640 is formed on p-type GaN contact layer 620. With an $SiO_2$ dielectric film 621, p-type first AlGaN clad layer 619 and p-type GaN contact layer 620 are formed on a center portion of p-type second AlGaN clad layer 618 in a shape of a stripe having a width of 40 μm. In addition, a length of a resonator is set to 400 μm.

Referring to FIG. 6, the nitride-based semiconductor laser (light-emitting element 601) is mounted on lead frame 106 having a surface portion covered with an Au film. One electrode of the nitride-based semiconductor laser is electrically connected via wire 103a to lead frame 106 which is electrically connected to one electrode terminal 107a, and the other electrode of the nitride-based semiconductor laser is electrically connected to the other electrode terminal 107b via wire 103b.

In this embodiment, which uses as light-emitting element 601 the semiconductor laser having a narrower radiation angle of excitation light as compared to the light-emitting diode, evenness of intensity of emitted fluorescent light is similarly increased because fluorescent light emitted from fluorescent body 104 is sufficiently scattered by fluorescent body 104 dispersed in dispersion body 105.

In this embodiment, since the light-emitting element which is the nitride-based semiconductor laser generally has a thickness of about 100 μm and a full angle at half maximum of a divergence angle of emitted excitation light of only about 50 degrees, dispersion body 105 having fluorescent body 104 to be irradiated with the excitation light dispersed therein can have a dimension (area) around several mm. As a result, a thickness of the light-emitting device can be approximated to the dimension of dispersion body 105 in this embodiment, and a very thin light-emitting device having high output efficiency can be obtained.

In addition, in this embodiment, evenness of intensity distribution of emitted fluorescent light is increased by using a light diffusion film having a light diffusion material for diffusing fluorescent light (for example, $TiO_2$ particles, which are not shown) dispersed therein as at least one region of window portion (window portion for outputting light) 109 from which the fluorescent light is output.

Furthermore, an ultraviolet absorption material formed with an organic material which absorbs light having a wavelength of at most 430 nm may be dispersed in the light diffusion film. Use of such light diffusion film in window portion 109 for outputting light can prevent a portion of the excitation light emitted from the semiconductor laser and not absorbed by the fluorescent body from being emitted to the outside.

It is to be noted that, the excitation light directly emitted from the semiconductor laser has strong spatial coherency, and therefore the excitation light is dangerous to eyes when it is directly seen. According to a structure of this embodiment, since the excitation light is sufficiently scattered by the fluorescent body and the spatial coherency is reduced, safety is ensured.

Figure 8A:
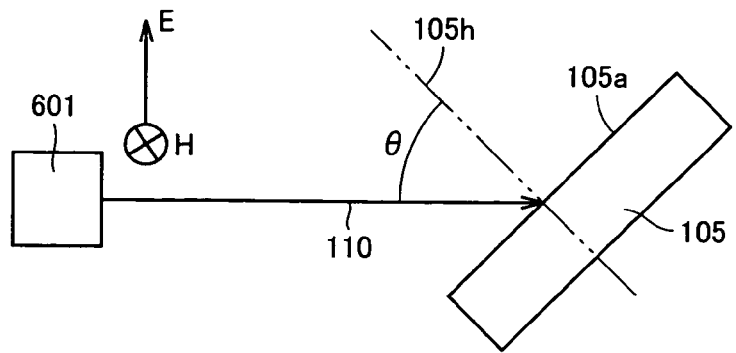
FIGS. 8A and 8B are schematic diagrams each describing polarization of excitation light entering a dispersion body.
Figure 8B:
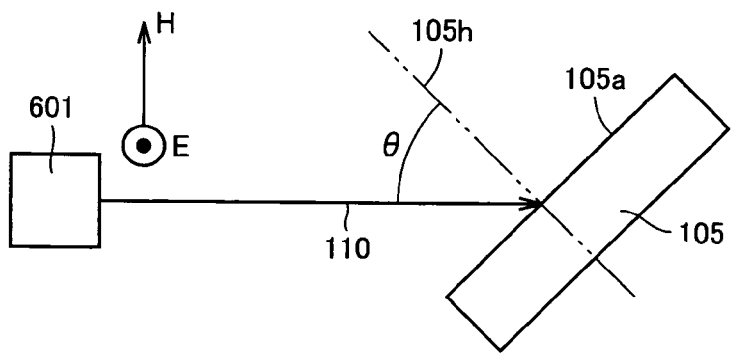

Referring to FIGS. 6, 7, 8A, 8B and 9, in the light-emitting device of this embodiment, the nitride-based semiconductor laser (light-emitting element 601) and dispersion body 105 are preferably arranged such that light emitted from the nitride-based semiconductor laser as light-emitting element 601 enters dispersion body 105 with P polarization. Generally, light output from a semiconductor laser has an aligned direction of polarization, and a magnetic field vector H is generated in a direction parallel to a thickness direction of an active layer (a vertical direction in FIG. 7) while an electric field vector E is generated in a direction perpendicular to the thickness direction of the active layer (a lateral direction in FIG. 7). Referring to FIG. 8A, "P polarization" means plane polarization in which a direction of electric field vector E of excitation light 110 entering dispersion body 105 is included in a plane of incidence (a plane including a normal 105h to a surface of the dispersion body on receiving side 105a and a traveling direction of excitation light 110, which is the same in the following). That is, P polarization has the direction of electric field vector E of the excitation light parallel to the plane of incidence (a plane including an incidence angle θ (a solid angle between normal 105h to the surface of dispersion body 105 on receiving side 105a and excitation light 110, which is the same in the following)). Referring to FIG. 8B, "S polarization" means plane polarization in which the direction of electric field vector E of excitation light 110 entering dispersion body 105 is perpendicular to the plane of incidence. That is, S polarization has the direction of electric field vector E of the excitation light perpendicular to the plane of incidence (a plane including incidence angle θ).

In the light-emitting device of this embodiment, the content of the fluorescent body in the dispersion body is preferably set such that intensity of reflected fluorescent light 120a becomes larger than intensity of transmitted fluorescent light 120b, as shown in FIG. 2. In the light-emitting device including the fluorescent body of such a content, most of excitation light not absorbed by the fluorescent body becomes reflected excitation light 110a. Therefore, when reflected excitation light 110a (a reflectance of excitation light with the dispersion body) can be decreased, utilization efficiency of excitation light can be increased and light emission efficiency of the light-emitting device can be increased.

The reflected excitation light described above can be broadly divided into two components. One component is a reflected component on a surface of dispersion body 105 on side 105a receiving excitation light. The reflected component can be calculated using a Fresnel's formula for reflection, and depends on a refractive index of a material of a binder for forming the dispersion body, a direction of polarization of incident light, incidence angle θ, and the like. The other component is a component of the excitation light which enters dispersion body 105, is diffused and reflected without being absorbed by fluorescent body 104, and then returns to the receiving side. An amount of this component depends on elements such as scatter and absorption properties and an amount of dispersion of the fluorescent body. When the nitride-based semiconductor laser (light-emitting element 601) and dispersion body 105 are arranged such that light emitted from the nitride-based semiconductor laser as light-emitting element 601 enters dispersion body 105 with P polarization, the reflected component (a Fresnel reflection component) of the two components of the reflected excitation light on the surface on receiving side 105a can be decreased, which can increase utilization efficiency of excitation light.

Figure 9:
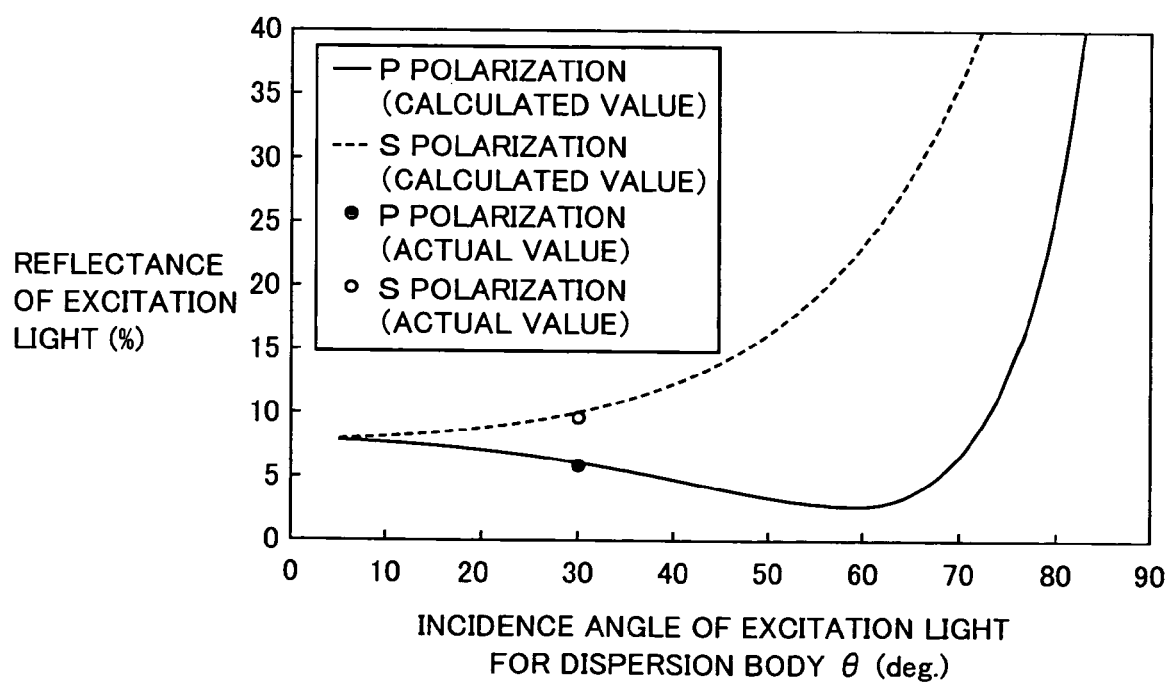
FIG. 9 is a diagram indicating a relation between an incidence angle θ of excitation light for a dispersion body and a reflectance of excitation light.

Referring to FIGS. 8A, 8B and 9, in this embodiment, a reflectance of excitation light 110 on receiving side 105a of dispersion body 105 (hereafter referred to as a reflectance of excitation light) was measured with arranging light-emitting element 601 and dispersion body 105 so as to allow light emitted from the semiconductor laser as light-emitting element 601 to enter the dispersion body with P polarization or S polarization. A nitride-based semiconductor laser having a light emission peak wavelength of 405 nm was used as light-emitting element 601. A dispersion body used as dispersion body 105 was formed by dispersing the red, green and blue fluorescent bodies described in the first embodiment (embodiments 1A and 1B), which were excited with excitation light from light-emitting element 601, in an epoxy resin plate having a thickness of 5 mm in a ratio to obtain a white color indicated with chromaticity coordinates of x=0.32 and y=0.32. Incidence angle θ of excitation light 110 to dispersion body 105 was set to 30 degrees. A reflectance in a situation in which excitation light 110 entered dispersion body 105 with P polarization was 6.0% (a point indicated with a black circle in FIG. 9), while a reflectance in a situation in which excitation light 110 entered dispersion body 105 with S polarization was 9.2% (a point indicated with a white circle in FIG. 9). That is, with arrangement of dispersion body 105 to allow excitation light 110 to enter dispersion body 105 with P polarization, the reflectance of excitation light 110 can be decreased and utilization efficiency of excitation light can be increased.

In addition, incidence angle θ of excitation light to the dispersion body and a Fresnel reflectance on the surface of the dispersion body on the receiving side in each of situations of P and S polarizations were calculated on a precondition that a refractive index of the epoxy resin is about 1.6. Furthermore, a whole reflectance of excitation light on the receiving side of the dispersion body was calculated on a precondition that about 2.5% of excitation light entering the dispersion body without being reflected on the surface of the receiving side was diffused and reflected without being absorbed by the fluorescent body and returned to the receiving side. Results are shown in FIG. 9. In FIG. 9, a solid line indicates a reflectance of excitation light in the situation of P polarization, and a broken line indicates a reflectance of excitation light in the situation of S polarization. As shown in FIG. 9, a curve obtained with calculation (a calculated value) matches well with a measured value (an actual value). Therefore, it became apparent that, with any incidence angle θ, the reflected component of excitation light can be decreased more in an arrangement of the dispersion body to allow the excitation light to enter the dispersion body with P polarization than in an arrangement for entering the dispersion body with S polarization.

As is obvious from FIG. 9, in terms of decreasing a reflectance of excitation light and increasing utilization efficiency of excitation light, it is preferable to arrange light-emitting element 601 and dispersion body 105 such that excitation light enters dispersion body 105 with P polarization, it is more preferable to set incidence angle θ to at least 30 degrees and at most 70 degrees, and it is further preferable to arrange to set incidence angle θ to a Brewster angle (about 58 degrees).

In the light-emitting device of this embodiment, in terms of increasing light output efficiency of the light-emitting device of this embodiment, the content of the fluorescent body in the dispersion body is also preferably set so as to increase, in fluorescent light emitted from the fluorescent body in the dispersion body, a total value of intensity of reflected fluorescent light emitted to the side receiving the excitation light and intensity of transmitted fluorescent light emitted to the side transmitting the excitation light, as shown in FIG. 5. More specifically, the content of the fluorescent body is preferably set such that, in fluorescent light emitted from the fluorescent body, a total value of intensity of reflected fluorescent light and intensity of transmitted fluorescent light becomes at least 90% of a maximum value thereof and, more preferably, at least 95% of the maximum value thereof.

Third Embodiment

Figure 10:
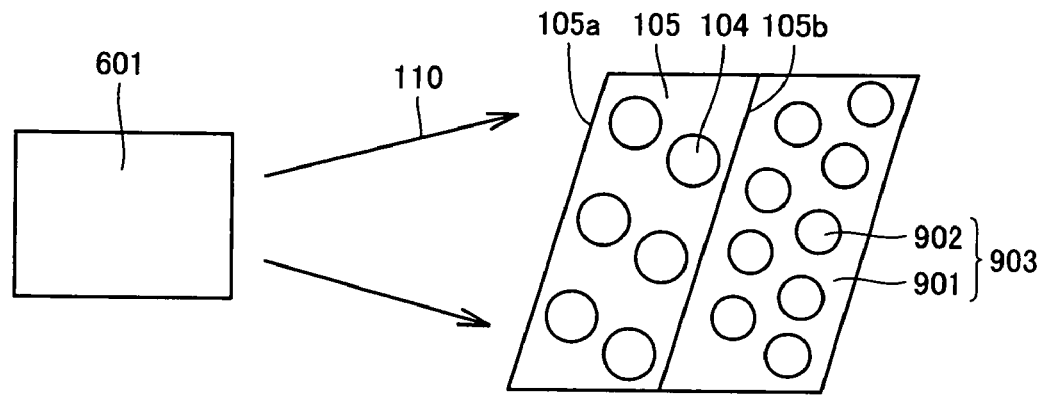
FIG. 10 is a schematic diagram of a main portion of a still another embodiment of the light-emitting device according to the present invention.

Referring to FIGS. 6 and 10, a still another embodiment of the light-emitting device according to the present invention is different from the light-emitting device of the second embodiment in that, a film having $TiO_2$ particles as a light scattering material 902 dispersed in a binder 901 is formed as an optical film 903 reflecting at least one of the excitation light and the fluorescent light on side 105b of dispersion body 105 transmitting excitation light 110, which dispersion body 105 has fluorescent body 104 dispersed therein. Output efficiency of the fluorescent light can further be increased by providing such optical film 903. With optical film 903, transmittances of excitation light and fluorescent light on transmitting side 105b of dispersion body 105 preferably become at most 5%.

A material of binder 901 is not specifically limited as long as the material transmits the excitation light and the fluorescent light, and an organic material such as an epoxy resin, a polycarbonate resin or an acrylic resin, an inorganic material such as glass, or the like can be used. The light scattering material is not specifically limited as long as the material can reflect and scatter the excitation light and the fluorescent light and, besides the $TiO_2$ particles, particles of an inorganic material such as SiO, $ZrO_2$, $Ta_2O_5$, sapphire, or quartz, particles of a metal such as gold or silver, particles of an organic material such as polyimide, polystyrene, polyvinyl chloride, or a silicon-based resin, or the like can also be used.

Fourth Embodiment

Figure 11:
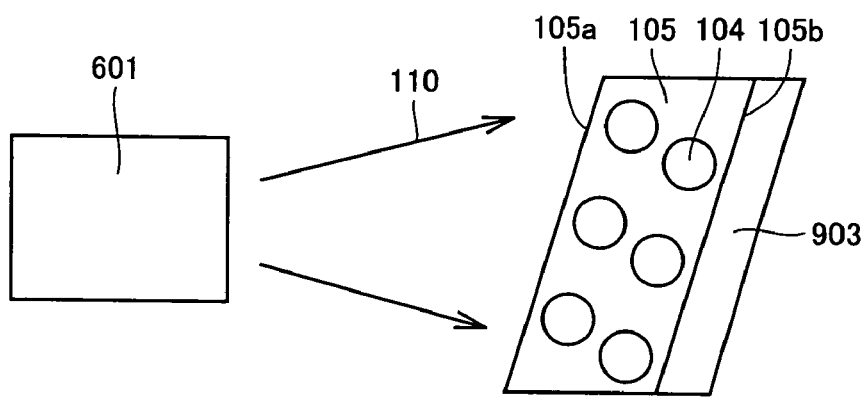
FIG. 11 is a schematic diagram of a main portion of a still another embodiment of the light-emitting device according to the present invention.

Referring to FIGS. 6 and 11, a still another embodiment of the light-emitting device according to the present invention is different from the light-emitting device of the second embodiment in that, an Al film which is a metal film is formed as optical film 903 reflecting at least one of the excitation light and the fluorescent light on side 105b of dispersion body 105 transmitting excitation light 110, which dispersion body 105 has fluorescent body 104 dispersed therein. Output efficiency of the fluorescent light can further be increased by providing such optical film 903. A film used as optical film 903 is not specifically limited as long as it can reflect the excitation light and the fluorescent light and, besides the Al film, a reflective metal film such as an Au film, an inorganic film having a refractive index larger than that of dispersion body 105 such as an oxide film or a nitride film, or the like can also be used.

Fifth Embodiment

Figure 12:
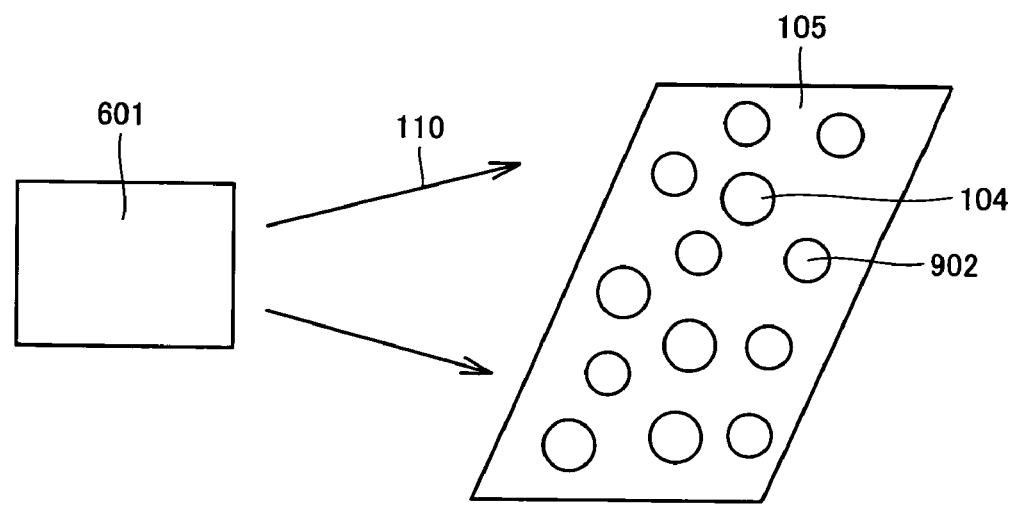
FIG. 12 is a schematic diagram of a main portion of a still another embodiment of the light-emitting device according to the present invention.

Referring to FIGS. 6 and 12, a still another embodiment of the light-emitting device according to the present invention is different from the light-emitting device of the second embodiment in that, light scattering material 902 for scattering the excitation light and the fluorescent light is dispersed in dispersion body 105 together with fluorescent body 104. Output efficiency of the fluorescent light can further be increased by dispersing light scattering material 902 in dispersion body 105 together with fluorescent body 104. In addition, reflectances and transmittances of the excitation light and the fluorescent light can be controlled by dispersing at least two kinds of particles having parameters of light scattering and/or light absorption different from each other, that is, fluorescent body 104 and light scattering material 902 in dispersion body 105 in a desired ratio. Light scattering material 902 is not specifically limited as long as the material can reflect and scatter the excitation light and the fluorescent light and, for example, particles of an inorganic material such as $TiO_2$, SiO, $ZrO_2$, $Ta_2O_5$, sapphire, or quartz, particles of a metal such as gold or silver, or particles of an organic material such as polyimide, polystyrene, polyvinyl chloride, or a silicon-based resin can be used.

Sixth Embodiment

Figure 13:
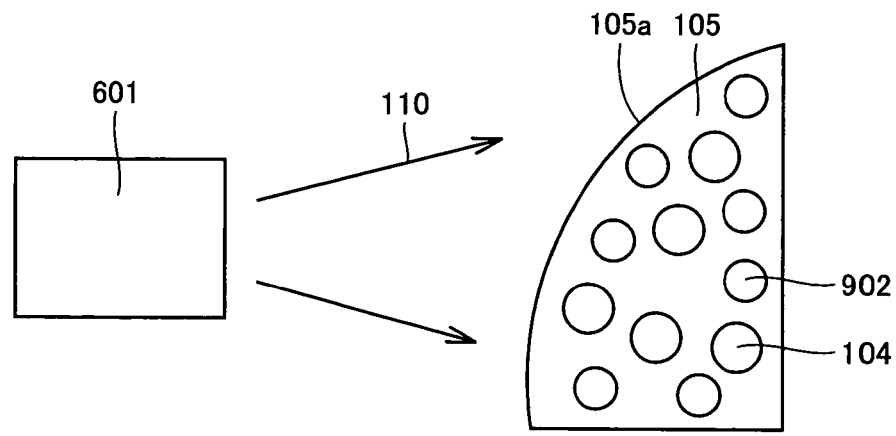
FIG. 13 is a schematic diagram of a main portion of a still another embodiment of the light-emitting device according to the present invention.

Referring to FIGS. 6, 12 and 13, a still another embodiment of the light-emitting device according to the present invention is different from the light-emitting device of the fifth embodiment in that, side 105a of dispersion body 105 receiving excitation light 110 has a convex surface. Dispersion body 105 having a convex surface on side 105a receiving excitation light 110 functions as a lens to further easily receive excitation light 110 and more easily emit the fluorescent light, and therefore intensity and output efficiency of the fluorescent light can further be increased.

Seventh Embodiment

Figure 14:
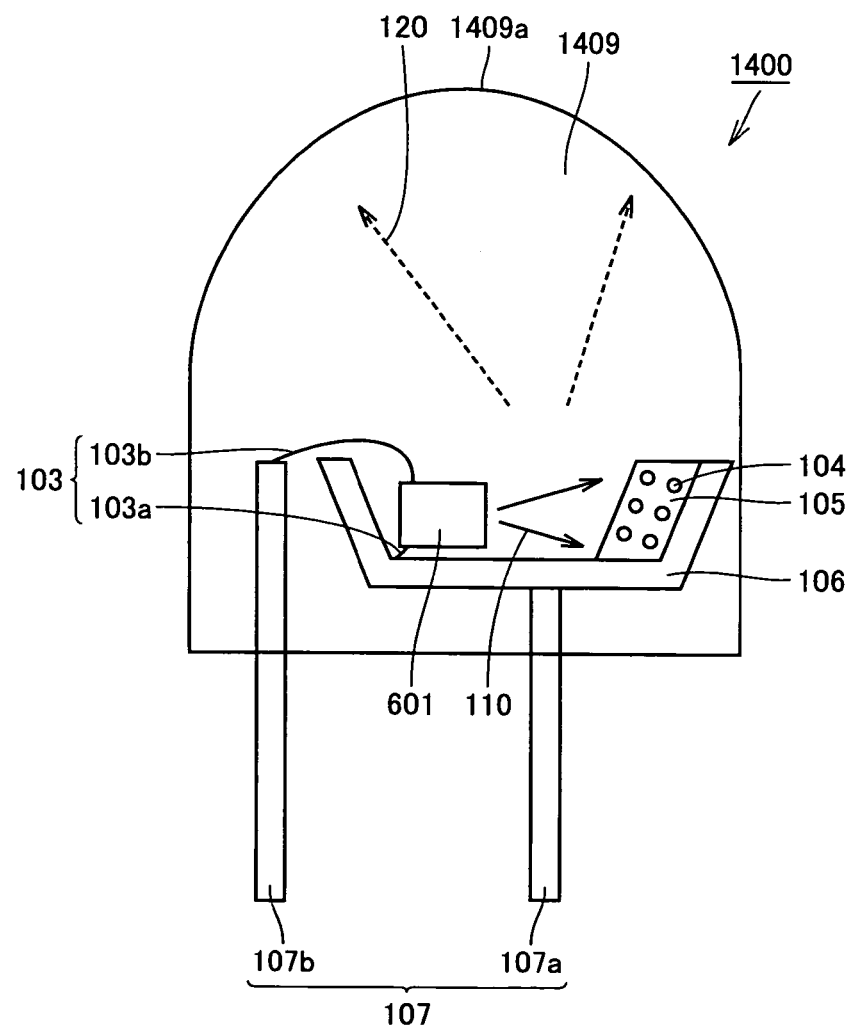
FIG. 14 is a schematic diagram of a still another embodiment of the light-emitting device according to the present invention.

Referring to FIGS. 6 and 14, a still another embodiment of the light-emitting device according to the present invention is different from the light-emitting device of the second embodiment in that, an exterior body 1409 is formed to cover light-emitting element 601 and dispersion body 105, and exterior body 1409 has a window portion surface for outputting fluorescent light (a light-outputting window portion surface) 1409a which is formed in a convex shape. By forming light-outputting window portion surface 1409a of exterior body 1409 in a convex shape, output efficiency of the fluorescent light is increased and intensity distribution of the fluorescent light can be controlled.

Eighth Embodiment

Figure 15:
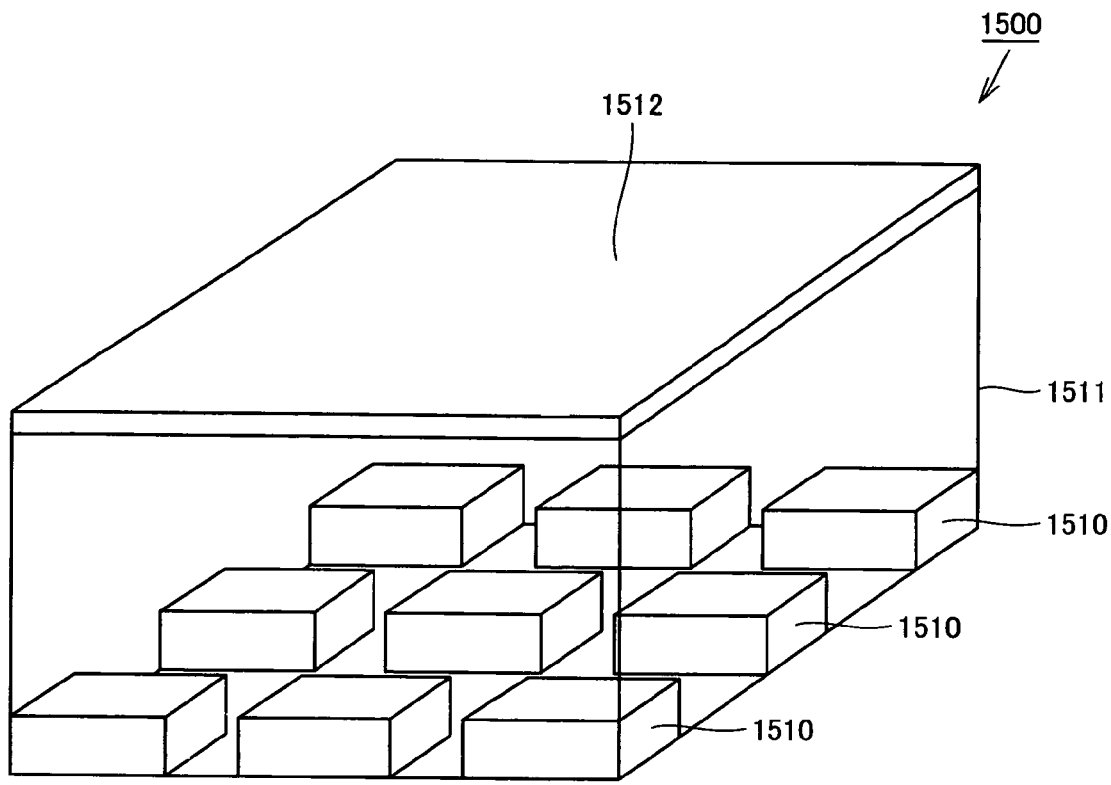
FIG. 15 is a schematic diagram of an embodiment of an illumination apparatus according to the present invention.

Referring to FIG. 15, an embodiment of an illumination apparatus 1500 according to the present invention includes at least one light-emitting device 1510 as described above. More specifically, a large number of light-emitting devices 1510 of the second embodiment, for example, are arranged in an array and attached to an aluminum chassis 1511, and a window portion 1512 for outputting fluorescent light emitted from light-emitting devices 1510 to the outside is provided on an upper surface portion of chassis 1511. A large illumination apparatus of a flat type is formed with a construction as described above. It is to be noted that, a number and an arrangement of the light-emitting devices are not limited by this embodiment, and many variations thereof can be adopted.

Ninth Embodiment

Figure 16:
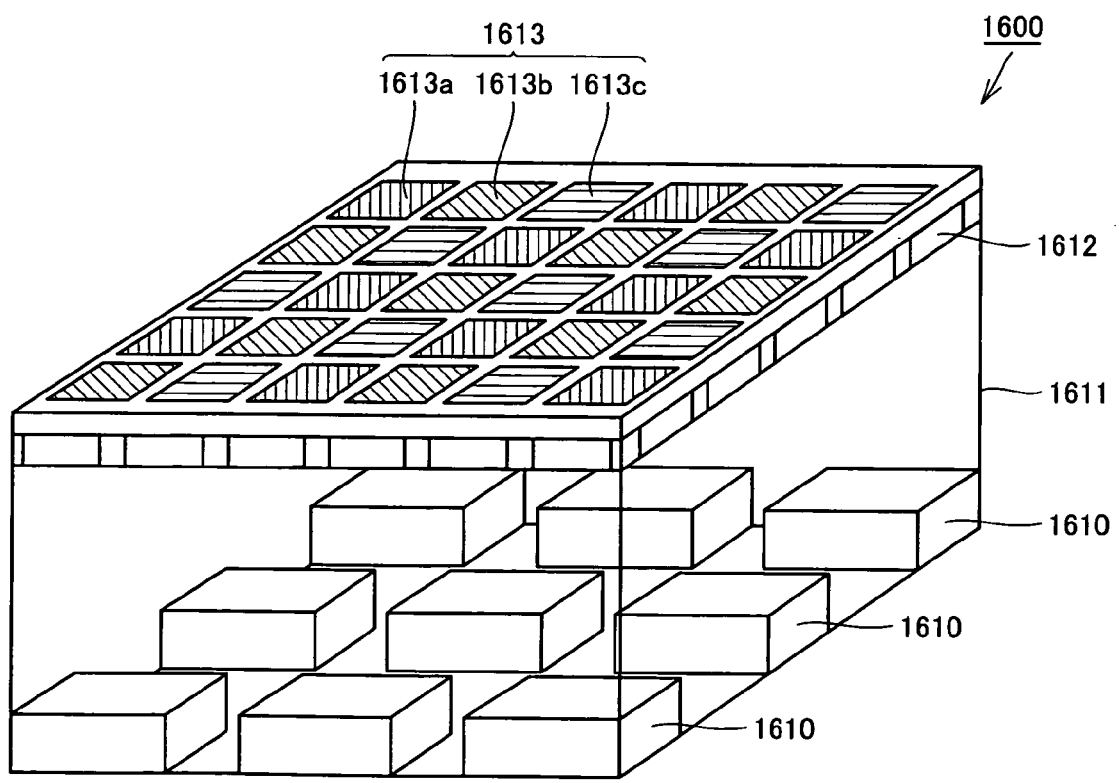
FIG. 16 is a schematic diagram of an embodiment of a display apparatus according to the present invention.
Figure 17:
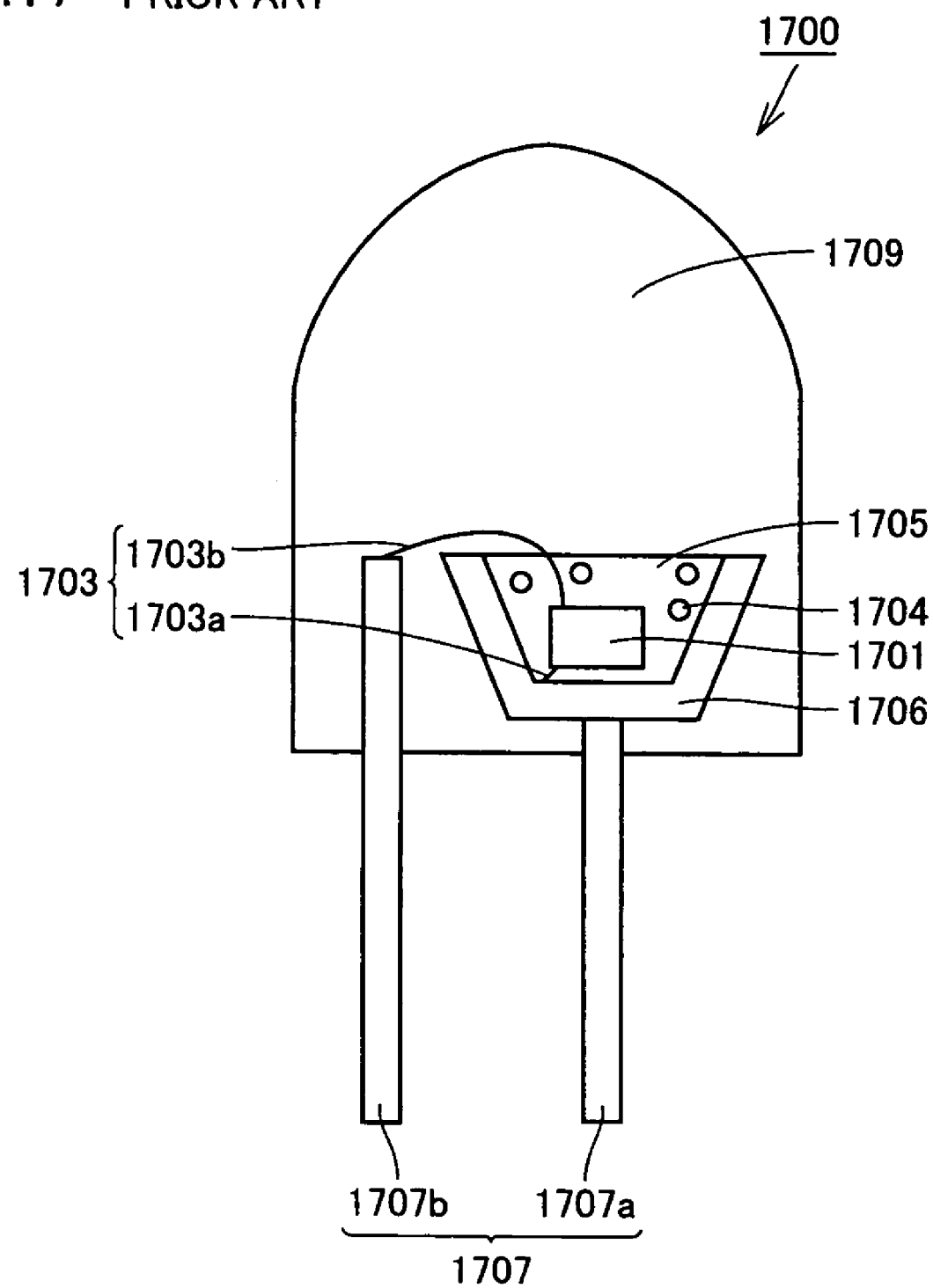
FIG. 17 is a schematic diagram of a conventional light-emitting device.

Referring to FIG. 16, an embodiment of a display apparatus 1600 according to the present invention includes at least one light-emitting device 1610 as described above, and a modulator for modulating intensity of light emitted from light-emitting device 1610 and color filters arranged in a matrix to receive light modulated with the modulator are provided. More specifically, a large number of light-emitting devices 1610 of the second embodiment, for example, are arranged in an array and attached to an aluminum chassis 1611, and a liquid crystal light modulation element 1612 including an active-matrix drive TFT (Thin Film Transistor) sandwiched between polarizing plates is provided on an upper surface portion of chassis 1611. Intensity of light emitted from light-emitting device 1610 is modulated (turned on/off) with liquid crystal light modulation element 1612. As the liquid crystal light modulation element, one having a construction used in an ordinary liquid crystal display apparatus such as a liquid crystal television can be used.

Red, green and blue color filters 1613 (a red filter 1613a, a green filter 1613b and a blue filter 1613c) are arranged in a matrix on liquid crystal light modulation element 1612. Light emission intensity is controlled with liquid crystal light modulation element 1612 to control intensity of light emitted to each color filter to enable displaying of a desired color image. It is to be noted that, a number and an arrangement of the light-emitting devices, the liquid crystal light modulation element or the color filters are not limited by this embodiment, and many variations thereof can be adopted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light-emitting device, comprising:
    a light-emitting element emitting excitation light for exciting a fluorescent body;
    a dispersion body having said fluorescent body dispersed therein, said fluorescent body emitting fluorescent light having a wavelength different from that of said excitation light; and
    a lead frame upon which said light-emitting element and said dispersion body are separately mounted such that said light-emitting element and said dispersion body are spaced apart; wherein
    at least a portion of the fluorescent light emitted from said fluorescent body in said dispersion body is output to the outside of said light-emitting device through a side of said dispersion body receiving said excitation light without being retransmitted through said dispersion body after passing through the side of said dispersion body receiving said excitation light,
    at least another portion of the fluorescent light emitted from said fluorescent body in said dispersion body is output to the outside of said light-emitting device through a side opposite of the side of said dispersion body receiving said excitation light without being transmitted through said dispersion body after passing through the side opposite of the side of said dispersion body receiving said excitation light, a content of said fluorescent body in said dispersion body is set such that, in fluorescent light emitted from said fluorescent body in said dispersion body, intensity of reflected fluorescent light emitted to the side receiving said excitation light becomes larger than intensity of transmitted fluorescent light emitted to a side transmitting said excitation light,
    the another portion of the fluorescent light is not reflected until after passing through the opposite side of the dispersion body,
    the portion of the fluorescent light and the another portion of the fluorescent light are output to the outside of said light-emitting device from a window portion for outputting the fluorescent light,
    said light-emitting element is formed with at least one nitride-based semiconductor laser, and
    said nitride-based semiconductor laser and said dispersion body are arranged such that light emitted from said nitride-based semiconductor laser enters said dispersion body with P polarization and at an incidence angle of at least 30 degrees and at most 70 degrees,
    such that a portion of the excitation light reflected by the side of said dispersion body receiving said excitation light is decreased and a utilization efficiency of the excitation light is increased.

2. The light-emitting device according to claim 1, wherein a content of said fluorescent body in said dispersion body is set such that, in fluorescent light emitted from said fluorescent body in said dispersion body, a total value of intensity of reflected fluorescent light emitted to the side receiving said excitation light becomes larger than intensity of transmitted fluorescent light emitted to a side transmitting said excitation light becomes at least 90% of a maximum value thereof.

3. The light-emitting device according to claim 1, wherein a content of said fluorescent body in said dispersion body is set such that, in fluorescent light emitted from said fluorescent body in said dispersion body, a total value of intensity of reflected fluorescent light emitted to the side receiving said excitation light becomes larger than intensity of transmitted fluorescent light emitted to a side transmitting said excitation light becomes at least 90% of a maximum value thereof.

4. The light-emitting device according to claim 1, wherein a light emission peak wavelength of said light-emitting element is from 400 nm to 420 nm.

5. The light-emitting device according to claim 1, wherein at least one fluorescent body selected from the group consisting of a red fluorescent body, a green fluorescent body, a blue fluorescent body, and an yellow fluorescent body is dispersed in said dispersion body.

6. The light-emitting device according to claim 1, wherein an optical film reflecting at least one of said excitation light and said fluorescent light is provided on a side of said dispersion body transmitting said excitation light.

7. The light-emitting device according to claim 6, wherein said optical film is formed with at least one of a metal film and a film having a light scattering material dispersed therein.

8. The light-emitting device according to claim 1, wherein a light dispersion material is further dispersed in said dispersion body.

9. The light-emitting device according to claim 1, wherein the side of said dispersion body receiving said excitation light has a convex surface.

10. The light-emitting device according to claim 1, wherein the lead frame holding said light-emitting element and said dispersion body has a concave portion for collecting the fluorescent light emitted from said fluorescent body in said dispersion body substantially in one direction.

11. The light-emitting device according to claim 1, wherein at least one of a metal film and a film having a light scattering material dispersed therein is formed on a surface of the lead frame holding said light-emitting element and said dispersion body.

12. The light-emitting device according to claim 1, wherein an optical film including a light diffusion material for diffusing at least one of said excitation light and said fluorescent light is provided on at least one region of a window portion for outputting the fluorescent light emitted from said fluorescent body in said dispersion body to the outside.

13. The light-emitting device according to claim 1, wherein an exterior body is formed to cover said light-emitting element and said dispersion body, and a window portion surface of said exterior body for outputting the fluorescent light is formed in a convex shape.

14. An illumination apparatus comprising at least one light-emitting device according to claim 1.

15. A display apparatus, comprising
at least one light-emitting device according to claim 1;
wherein a modulator for modulating intensity of light emitted from said light-emitting device and color filters arranged in a matrix to receive light modulated with said modulator are provided.

* * * * *